US012123779B2

(12) United States Patent
Tsai et al.

(10) Patent No.: US 12,123,779 B2
(45) Date of Patent: Oct. 22, 2024

(54) FAR INFRARED (FIR) SENSOR DEVICE AND MANUFACTURING METHOD THEREOF AND DETERMINATION METHOD OF THICKNESS OF SENSOR DIELECTRIC LAYER THEREOF

(71) Applicant: PixArt Imaging Incorporation, Hsinchu (TW)

(72) Inventors: Ming-Han Tsai, Hsinchu (TW); Chih-Fan Hu, Hsinchu (TW)

(73) Assignee: PIXART IMAGING INCORPORATION, Hsinchu (TW)

( * ) Notice: Subject to any disclaimer, the term of this patent is extended or adjusted under 35 U.S.C. 154(b) by 398 days.

(21) Appl. No.: 17/676,656

(22) Filed: Feb. 21, 2022

(65) Prior Publication Data

US 2022/0364927 A1 Nov. 17, 2022

(30) Foreign Application Priority Data

May 11, 2021 (TW) .................................. 110116949

(51) Int. Cl.
*G01J 5/02* (2022.01)
*G01J 5/12* (2006.01)
*H01L 31/101* (2006.01)
*H01L 31/18* (2006.01)

(52) U.S. Cl.
CPC ................. *G01J 5/024* (2013.01); *G01J 5/12* (2013.01); *H01L 31/101* (2013.01); *H01L 31/18* (2013.01)

(58) Field of Classification Search
CPC ........... G01J 5/024; G01J 5/12; H01L 31/101; H01L 31/18; H01L 27/0617
See application file for complete search history.

(56) References Cited

U.S. PATENT DOCUMENTS

| 10,859,442 | B2 * | 12/2020 | Tsai ......................... G01J 5/16 |
| 2021/0126038 | A1 * | 4/2021 | Kropelnicki ............ G01J 5/046 |
| 2023/0031112 | A1 * | 2/2023 | Tsai ......................... G01J 5/14 |

OTHER PUBLICATIONS

Chen SJ, Chen B. Research on a CMOS-MEMS Infrared Sensor with Reduced Graphene Oxide. Sensors (Basel). Jul. 18, 2020;20(14):4007. doi: 10.3390/s20144007. PMID: 32708509; PMCID: PMC7412089. (Year: 2020).*

* cited by examiner

*Primary Examiner* — Joe E. Schoenholtz
(74) *Attorney, Agent, or Firm* — Tung & Associates

(57) ABSTRACT

The present invention provides a far infrared (FIR) sensor device formed on a substrate, wherein the FIR sensor device includes: a sensor region, which is formed on the substrate, and is configured to operably sense a far infrared signal; and a sensor dielectric layer, which is formed on the sensor region, wherein a thickness of the sensor dielectric layer is determined by a sacrificial metal layer.

19 Claims, 16 Drawing Sheets

FAR INFRARED (FIR) SENSOR DEVICE AND MANUFACTURING METHOD THEREOF AND DETERMINATION METHOD OF THICKNESS OF SENSOR DIELECTRIC LAYER THEREOF

CROSS REFERENCE

The present invention claims priority to TW 110116949 filed on May 11, 2021.

BACKGROUND OF THE INVENTION

Field of Invention

The present invention relates to a far infrared (FIR) sensor device; particularly, it relates to such FIR sensor device in which a sacrificial metal layer is employed to determine a thickness of a sensor dielectric layer of the FIR sensor device. The present invention also relates to a manufacturing method of the FIR sensor device and a determination method of the thickness of the sensor dielectric layer of the FIR sensor device.

Description of Related Art

FIG. 1 is a schematic diagram showing a cross-section view of a prior art far infrared (FIR) sensor device. The FIR sensor device 10 is formed on a substrate 11, and has a sensor region 16. The sensor region 16 is formed on the substrate 11, for sensing an FIR signal FIR1. The FIR sensor device 10 includes a sensor dielectric layer 12, and the sensor region 16 is located in the sensor dielectric layer 12. Specifically, the sensor region 16 includes a thermopile structure 161 and partition structures 162 and 163. From top view, or, from a direction of view which is perpendicular to the substrate surface, the partition structures 162 and 163 form a ring structure surrounding the thermopile structure 161. Each of the thermopile structure 161 and the partition structures 162 and 163 includes a poly silicon layer poly1 and a poly silicon layer poly2.

When the FIR sensor device 10 is manufactured by a CMOS process, a periphery circuit 15 is also formed on the substrate 11, wherein the periphery circuit 15 includes: at least one metal oxide semiconductor (MOS) device 17, plural metal layers M1-M4 (for example four metal layers, but the number is not limited to four), and plural layers of conductive plugs V. The plural layers of conductive plugs V electrically connect the plural metal layers M1-M4 and the MOS device 17. The aforementioned conduction structures are insulated by the sensor dielectric layer 12.

The prior art FIR sensor device 10 has a drawback that the thickness h0 of the sensor dielectric layer 12 above the sensor region 16 is limited by the CMOS process and cannot be adjusted flexibly. As thus, the sensor performance of the FIR sensor device 10 cannot be precisely controlled and adjusted as desired when the FIR sensor 10 senses the FIR signal FIR1, and the frame rate of the FIR sensor 10 is also adversely impacted.

In view of the above, the present invention proposes an FIR sensor device wherein the thickness of the sensor dielectric layer above the sensor region can be determined precisely. The present invention also proposes a manufacturing method and a determination method of thickness of the sensor dielectric layer of such an FIR sensor device.

SUMMARY OF THE INVENTION

From one perspective, the present invention provides a far infrared (FIR) sensor device including: a sensor region, which is formed on a substrate, and is configured to operably sense a far infrared signal; and a sensor dielectric layer, which is formed on the sensor region, wherein a thickness of the sensor dielectric layer is determined by a sacrificial metal layer.

In one embodiment, the thickness of the sensor dielectric layer is determined by steps including: forming the sensor dielectric layer on the sensor region with the thickness; depositing the sacrificial metal layer on the sensor dielectric layer; forming an intermediate dielectric layer on the sacrificial metal layer; etching the intermediate dielectric layer by a first etch process step, wherein an etch rate of the first etch process step etching the intermediate dielectric layer is higher than an etch rate of the first etch process step etching the sacrificial metal layer, wherein the sacrificial metal layer is an etch stop layer of the first etch process step; and etching the sacrificial metal layer by a second etch process step.

From another perspective, the present invention provides a manufacturing method of a far infrared (FIR) sensor device, including: forming a sensor region in a substrate, wherein the sensor region is configured to operably sense a far infrared signal; forming a sensor dielectric layer on the sensor region with a thickness; depositing a sacrificial metal layer on the sensor dielectric layer; forming an intermediate dielectric layer on the sacrificial metal layer; etching the intermediate dielectric layer by a first etch process step, wherein an etch rate of the first etch process step etching the intermediate dielectric layer is higher than an etch rate of the first etch process step etching the sacrificial metal layer, wherein the sacrificial metal layer is an etch stop layer of the first etch process step; and etching the sacrificial metal layer by a second etch process step.

From another perspective, the present invention provides a determination method of a thickness of a sensor dielectric layer of a far infrared (FIR) sensor device, wherein the FIR sensor device is formed on a substrate, and includes: a sensor region, which is configured to operably sense a far infrared signal; and a sensor dielectric layer, which is formed on the sensor region with a thickness; the determination method including: depositing a sacrificial metal layer on the sensor dielectric layer; forming an intermediate dielectric layer on the sacrificial metal layer; etching the intermediate dielectric layer by a first etch process step, wherein an etch rate of the first etch process step etching the intermediate dielectric layer is higher than an etch rate of the first etch process step etching the sacrificial metal layer, wherein the sacrificial metal layer is an etch stop layer of the first etch process step; and etching the sacrificial metal layer by a second etch process step.

In one embodiment, a periphery circuit is formed on the substrate, wherein the periphery circuit includes at least one metal oxide semiconductor (MOS) device and a plurality of metal layers, and wherein one of the plural metal layers and the sacrificial metal layer are formed by a same metal deposition process step.

In one embodiment, the FIR sensor device further includes a stop layer which is formed on the sensor dielectric layer.

In one embodiment, the thickness of the sensor dielectric layer is determined further by a process step of depositing the stop layer between the sensor dielectric layer and the sacrificial metal layer; wherein an etch rate of the second etch process step etching the sacrificial metal layer is higher than an etch rate of the second etch process step etching the stop layer, wherein the stop layer is an etch stop layer of the second etch process step.

In one embodiment, the first etch process step is an anisotropic etch process step, and the second etch process step is an isotropic etch process step.

In one embodiment, the second etch process step is a wet etch process step which employs an etch solution including tetramethylammonium hydroxide (TMAH) solution and/or potassium hydroxide (KOH) solution.

In one embodiment, the FIR sensor device includes a thermopile sensor device.

The objectives, technical details, features, and effects of the present invention will be better understood with regard to the detailed description of the embodiments below.

DESCRIPTION OF THE PREFERRED EMBODIMENTS

The drawings as referred to throughout the description of the present invention are for illustration only, to show the interrelations among the circuit components and the interrelations among the layout areas, but not drawn according to actual scale.

Figure 1:
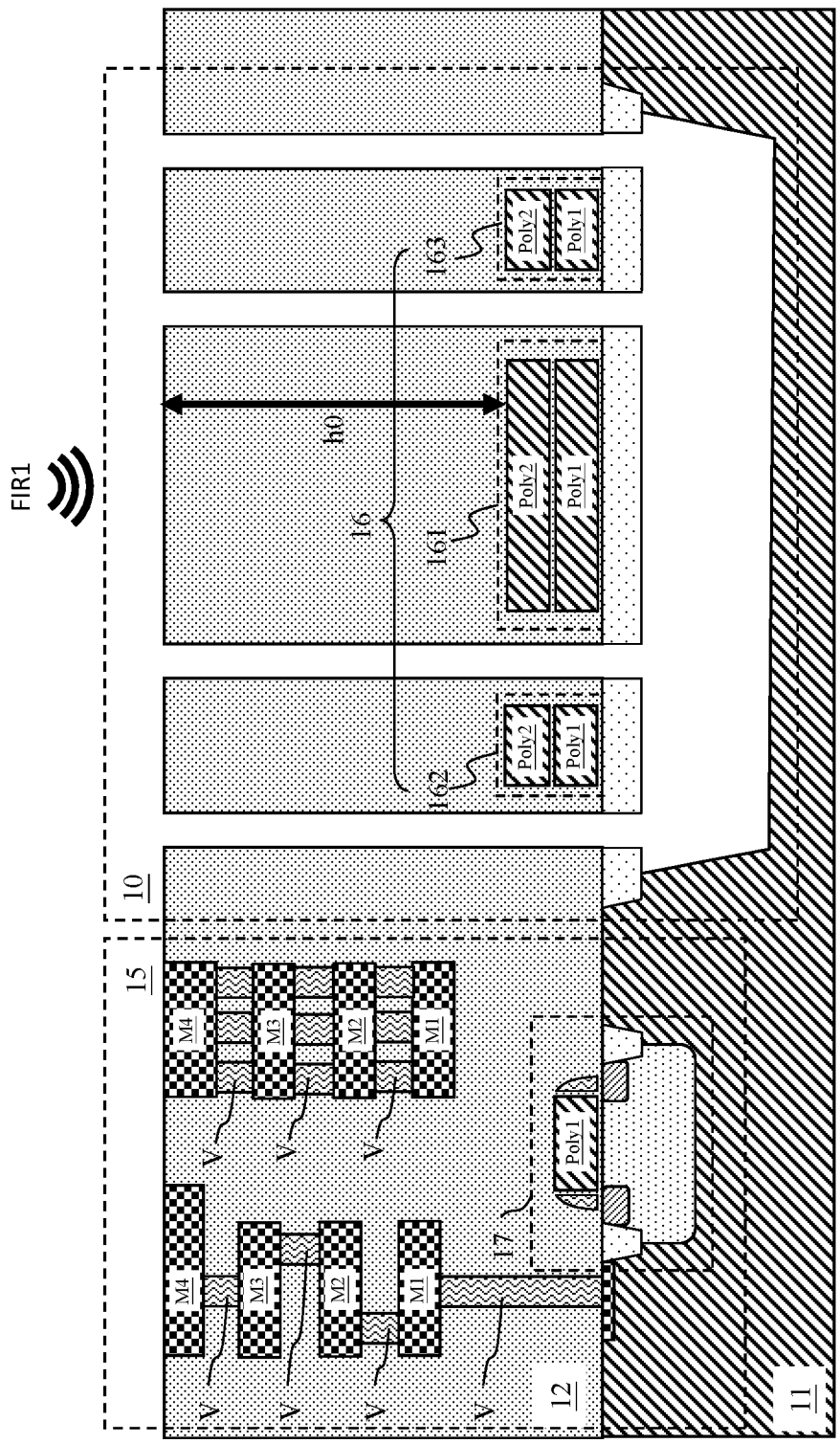
FIG. 1 is a schematic diagram showing a cross-section view of a prior art FIR sensor device.
Figure 2:
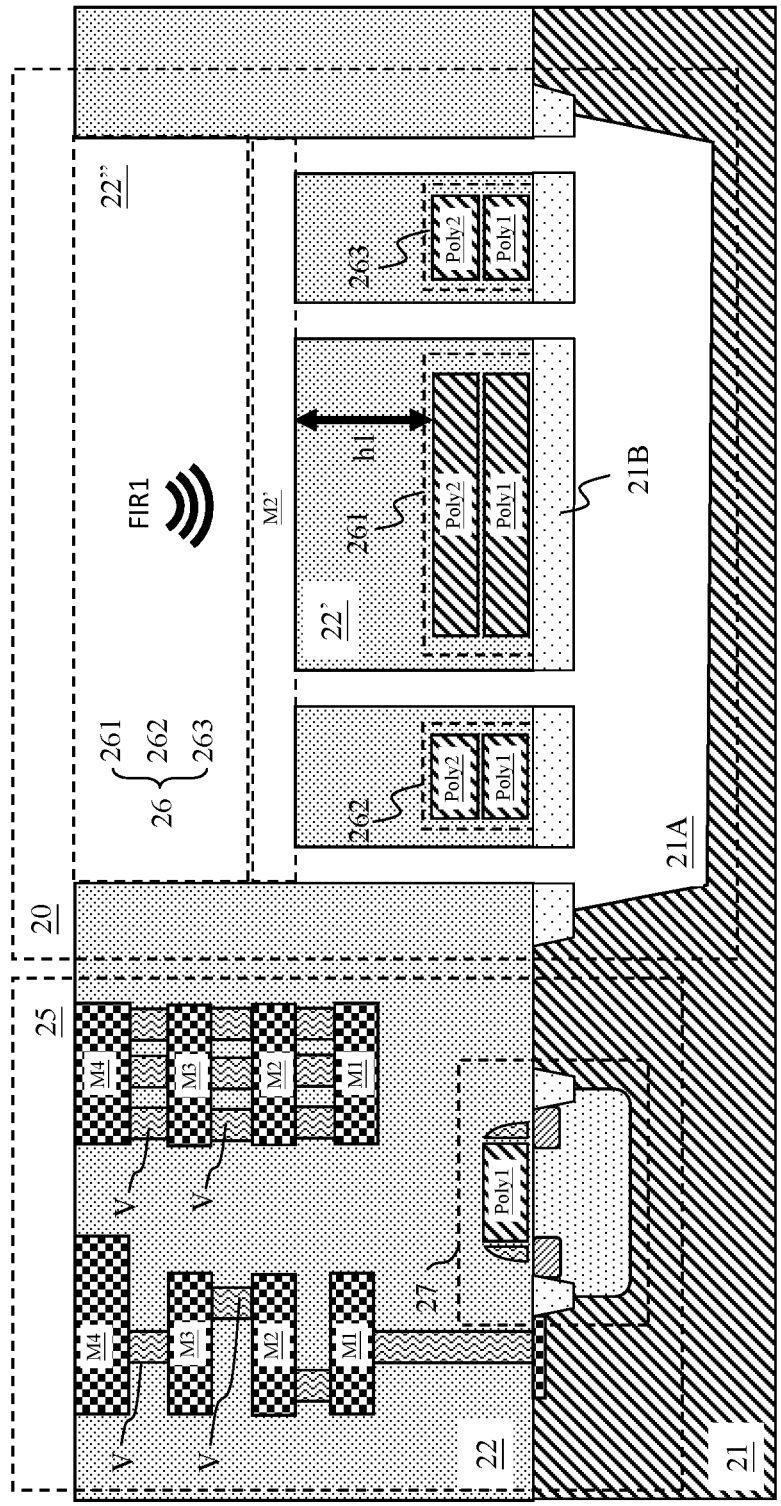
FIG. 2 is a schematic diagram showing a cross-section view of an FIR sensor device according to one embodiment of the present invention.

FIG. 2 is a schematic diagram showing a cross-section view of an FIR sensor device according to one embodiment of the present invention. As shown in FIG. 2, a far infrared (FIR) sensor device 20 is formed on a substrate 21 and has a sensor region 26. The sensor region 26 is formed on the substrate 21, wherein the sensor region 26 is configured to operably sense a far infrared (FIR) signal FIR1. The FIR sensor device 20 also includes a sensor dielectric layer 22' which is formed on the sensor region 26, wherein a thickness h1 of the sensor dielectric layer 22' is determined by a sacrificial metal layer M2', which will be explained in more detail later. The sensor region 26 includes a thermopile structure 261 and partition structures 262 and 263. From top view, or, from a direction of view which is perpendicular to the substrate surface, the partition structures 262 and 263 form a ring structure surrounding the thermopile structure 261. Each of the thermopile structure 261 and the partition structures 262 and 263 includes a poly silicon layer poly1 and a poly silicon layer poly2.

When the FIR sensor device 20 is manufactured by a CMOS process, a periphery circuit 25 is also formed on the substrate 21, wherein the periphery circuit 25 includes: at least one metal oxide semiconductor (MOS) device 27, plural metal layers M1-M4 (for example 4 metal layers, but the number is not limited to 4), and plural layers of conductive plugs V. The plural layers of conductive plugs V electrically connect the plural metal layers M1-M4 and the MOS device 27. The aforementioned conduction structures are insulated by the sensor dielectric layer 22. The plural metal layers M1-M4 for example include aluminum, copper, aluminum-copper alloy or other conductive materials. The plural layers of conductive plugs V for example include tungsten, poly silicon, aluminum, copper, aluminum-copper alloy or other conductive materials. In one preferable embodiment, both the dielectric layer 22 and the sensor dielectric layer 22' include silicon di-oxide layers.

In this embodiment, the substrate 21 is for example but not limited to a silicon substrate. In one preferable embodiment, the substrate 21 includes an empty chamber 21A, wherein the sensor region 26 is formed on the empty chamber 21A of the substrate 21. The sensor region 26 is configured to operably sense FIR signals. Specifically, an infrared signal is an electromagnetic wave signal with a wavelength between microwave and visible light; in general, the wavelength of infrared is between 0.7 μm and 1000 μm, which can be categorized into near infrared, mid infrared, far infrared and ultra-far infrared ranges, which are well known by those skilled in the art, so details thereof are not redundantly explained here. In one preferable embodiment, the sensor region 26 is configured to operably sense the FIR signal FIR1. In one preferable embodiment, the FIR sensor device 20 further includes an insulation layer 21B, which is for example but not limited to a shallow trench isolation (STI) structure, a local oxidation of silicon (LOCOS) structure, or a chemical vapor deposition (CVD) oxide region, as well known by those skilled in the art, so details thereof are redundantly explained here.

Referring to FIG. 2, the thickness h1 of the sensor dielectric layer 22' is determined by the sacrificial metal layer M2' in the present invention. In one preferable embodiment, the sacrificial metal layer M2' and the metal layer M2 of the periphery circuit 25 are formed by a same metal deposition process step. The periphery circuit 25 for example includes a MOS device 27 and four metal layers M1-M4, and one of the metal layers M1-M4, in this embodiment the metal layer M2, and the sacrificial metal layer M2', are formed by a same metal deposition process step.

In one preferable embodiment, the thickness h1 of the sensor dielectric layer 22' is determined by steps including: first, forming the sensor dielectric layer 22' on the sensor region 26 with the thickness h1; next, depositing the sacrificial metal layer M2' on the sensor dielectric layer 22'; next, forming an intermediate dielectric layer 22" on the sacrificial metal layer M2'; next, etching the intermediate dielectric layer 22' by a first etch process step, wherein an etch rate of the first etch process step etching the intermediate dielectric layer 22" is higher than an etch rate of the first etch process step etching the sacrificial metal layer M2', wherein the sacrificial metal layer M2' is an etch stop layer of the first etch process step; and next, etching the sacrificial metal layer M2' by a second etch process step.

In one preferable embodiment, the aforementioned first etch process step is an anisotropic etch process step, and the aforementioned second etch process step is an isotropic etch process step. In one preferable embodiment, the second etch process step is a wet etch process step, employing an etch solution including tetramethylammonium hydroxide (TMAH) solution and/or potassium hydroxide (KOH) solution.

Still referring to FIG. 2, different from the thickness h0 of the sensor dielectric layer 12 of the prior art FIR sensor device 10, the thickness h1 of the sensor dielectric layer 22' of the FIR sensor device 20 is adjustable and well controllable, and it can be formed thinner than the thickness h0 of the sensor dielectric layer 12 of the prior art FIR sensor device 10; an empty chamber can thus be formed above the sensor dielectric layer 22', whereby the FIR signal FIR1 can reach and be received by the sensor region 26 through a shorter distance of the thinner sensor dielectric layer 22' relatively to the sensor dielectric layer 12 of the prior art FIR sensor device 10. The present invention thus increases the accuracy and stability in sensing signals, and increases the sensor performance and frame rate.

According to the present invention, in another embodiment, the sacrificial metal layer M2' may not be formed by the same metal deposition process step as for forming the metal layer M2 of the periphery circuit 25 on the substrate 21; instead, the sacrificial metal layer M2' can be formed by a same metal deposition process step as for forming the metal layer M1, M3, or M4 of the periphery circuit 25 on the substrate 21, to adjust the thickness h1 of the sensor dielectric layer 22'. Or, in another embodiment, the sacrificial metal layer M2' can be formed by a separate metal deposition process step which is not the same as for the metal deposition process step forming any of the metal layers M1-M4 of the periphery circuit 25 on the substrate 21. However, preferably, the sacrificial metal layer M2' and one of the metal layers M1-M4 of the periphery circuit 25 on the substrate 21 are formed by a same metal deposition process step, to save manufacturing cost.

In one embodiment, the FIR sensor device 20 includes a thermopile sensor device.

Figure 3:
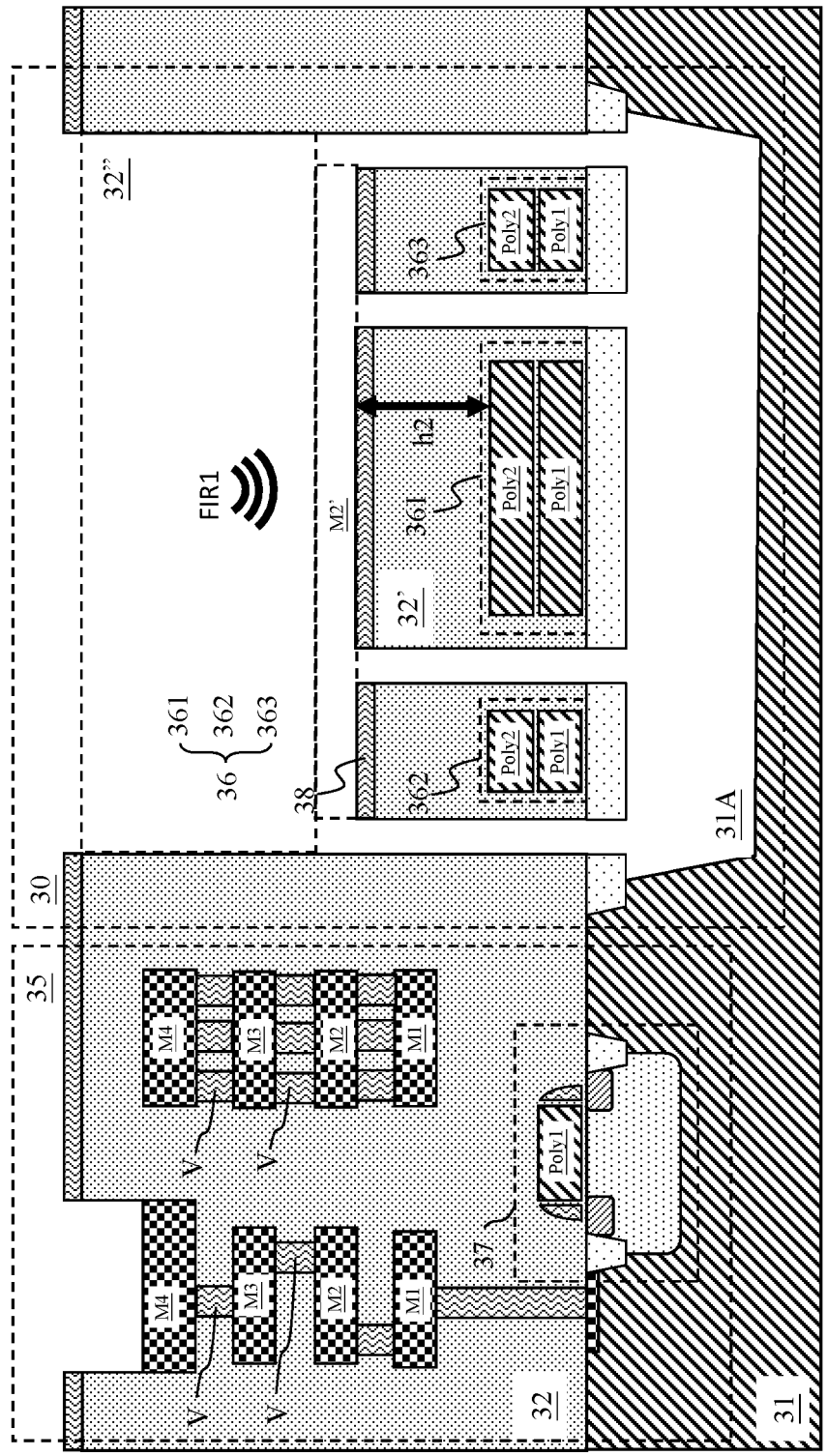
FIG. 3 is a schematic diagram showing a cross-section view of an FIR sensor device according to one embodiment of the present invention.

FIG. 3 is a schematic diagram showing a cross-section view of an FIR sensor device according to one embodiment of the present invention. As shown in FIG. 3, a far infrared (FIR) sensor device 30 is formed on a substrate 31 and has a sensor region 36. The sensor region 36 is formed on the substrate 31, wherein the sensor region 36 is configured to operably sense a far infrared (FIR) signal FIR1. The FIR sensor device 30 also includes a sensor dielectric layer 32' which is formed on the sensor region 36, wherein a thickness h2 of the sensor dielectric layer 32' is determined by a sacrificial metal layer M2', which will be explained in more detail later. The sensor region 36 includes a thermopile structure 361 and partition structures 362 and 363. From top view, or, from a direction of view which is perpendicular to the substrate surface, the partition structures 362 and 363 form a ring structure surrounding the thermopile structure 361. Each of the thermopile structure 361 and the partition structures 362 and 363 includes a poly silicon layer poly1 and a poly silicon layer poly2.

When the FIR sensor device 30 is manufactured by a CMOS process, a periphery circuit 35 is also formed on the substrate 31, wherein the periphery circuit 35 includes: at least one metal oxide semiconductor (MOS) device 37, plural metal layers M1-M4 (for example 4 metal layers, but the number is not limited to 4), and plural layers of conductive plugs V. The plural layers of conductive plugs V electrically connect the plural metal layers M1-M4 and the MOS device 37. The aforementioned conduction structures are insulated by the sensor dielectric layer 32.

This embodiment is different from the embodiment shown in FIG. 2 in that, in this embodiment, the FIR sensor device 30 further includes a stop layer 38 which is formed on the sensor dielectric layer 32'. The stop layer 38 includes for example but not limited to a silicon nitride layer. The function of the stop layer 38 will be depicted in detail later.

In one preferable embodiment, the thickness h2 of the sensor dielectric layer 32' is determined by steps including: first, forming the sensor dielectric layer 32' on the sensor region 36 with the thickness h2; next, depositing the stop layer 38 on the sensor dielectric layer 32'; next, depositing the sacrificial metal layer M2' on the stop layer 38; next, forming an intermediate dielectric layer 32" on the sacrificial metal layer M2'; next, etching the intermediate dielectric layer 32" by a first etch process step, wherein an etch rate of the first etch process step etching the intermediate dielectric layer 32" is higher than an etch rate of the first etch process step etching the sacrificial metal layer M2', wherein the sacrificial metal layer M2' is an etch stop layer of the first etch process step; and next, etching the sacrificial metal layer M2' by a second etch process step.

In a vertical direction, the stop layer 38 is located between the sensor dielectric layer 32' and the sacrificial metal layer M2'. An etch rate of the second etch process step etching the sacrificial metal layer M2' is higher than an etch rate of the second etch process step etching the stop layer 38, wherein the stop layer 38 is an etch stop layer of the second etch process step.

Figure 4A:
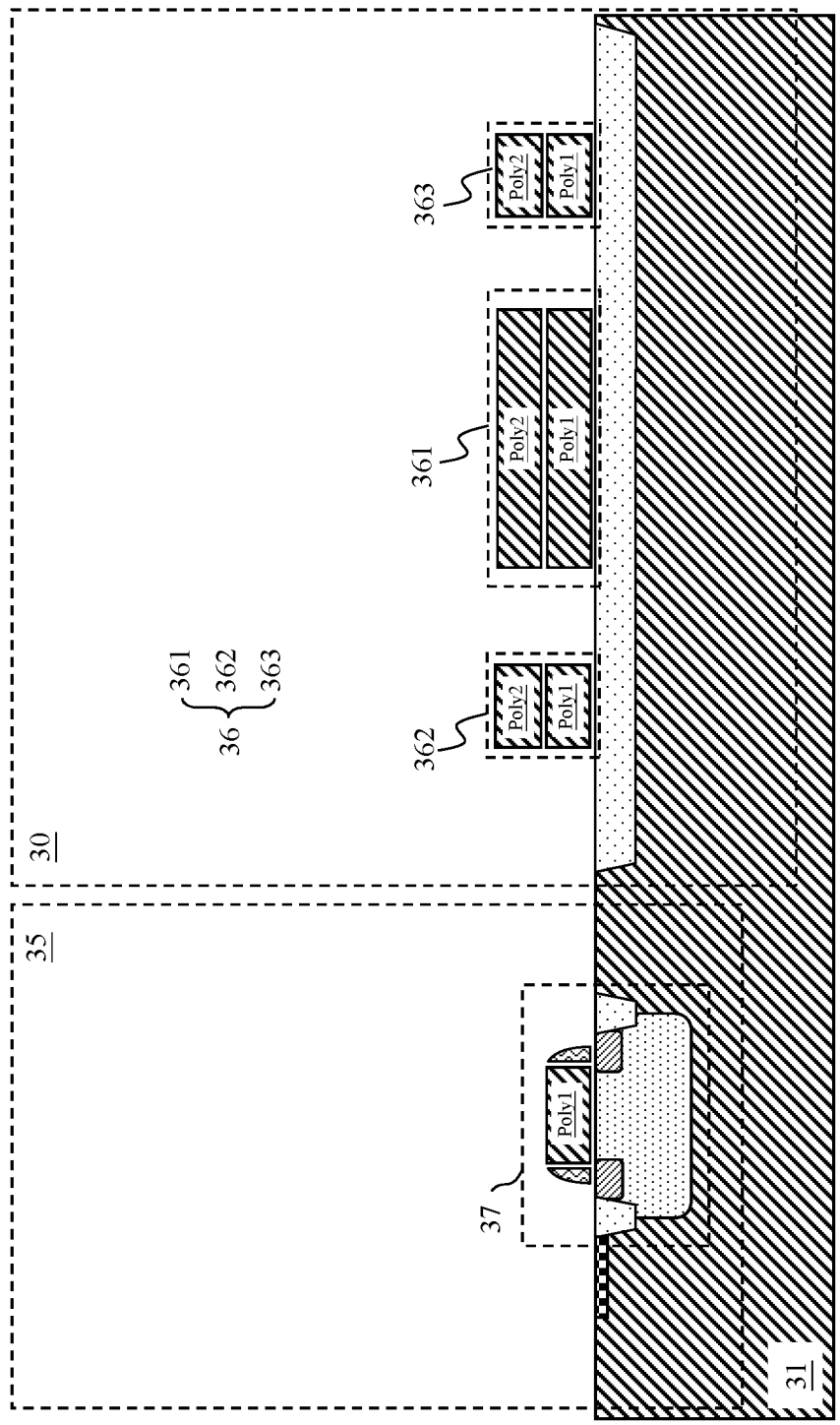
FIGS. 4A-4L are schematic diagrams showing cross-section views of a manufacturing method of an FIR sensor device according to one embodiment of the present invention.

FIGS. 4A-4L are schematic diagrams showing cross-section views of a manufacturing method of the FIR sensor device 30 according to one embodiment of the present invention. FIGS. 4A-4L explain how the FIR sensor device 30 is manufactured and also explain a determination method of the thickness h2 of the sensor dielectric layer 32' of the FIR sensor device 30. As shown in FIG. 4A, first, the sensor region 36 and the MOS device 7 are formed on the substrate 31. The sensor region 36 is configured to operably sense the FIR signal FIR1. The sensor region 36 includes a thermopile structure 361 and partition structures 362 and 363. From top view, or, from a direction of view which is perpendicular to the substrate surface, the partition structures 362 and 363 form a ring structure surrounding the thermopile structure 361. Each of the thermopile structure 361 and the partition structures 362 and 363 includes a poly silicon layer poly1 and a poly silicon layer poly2.

Figure 4B:
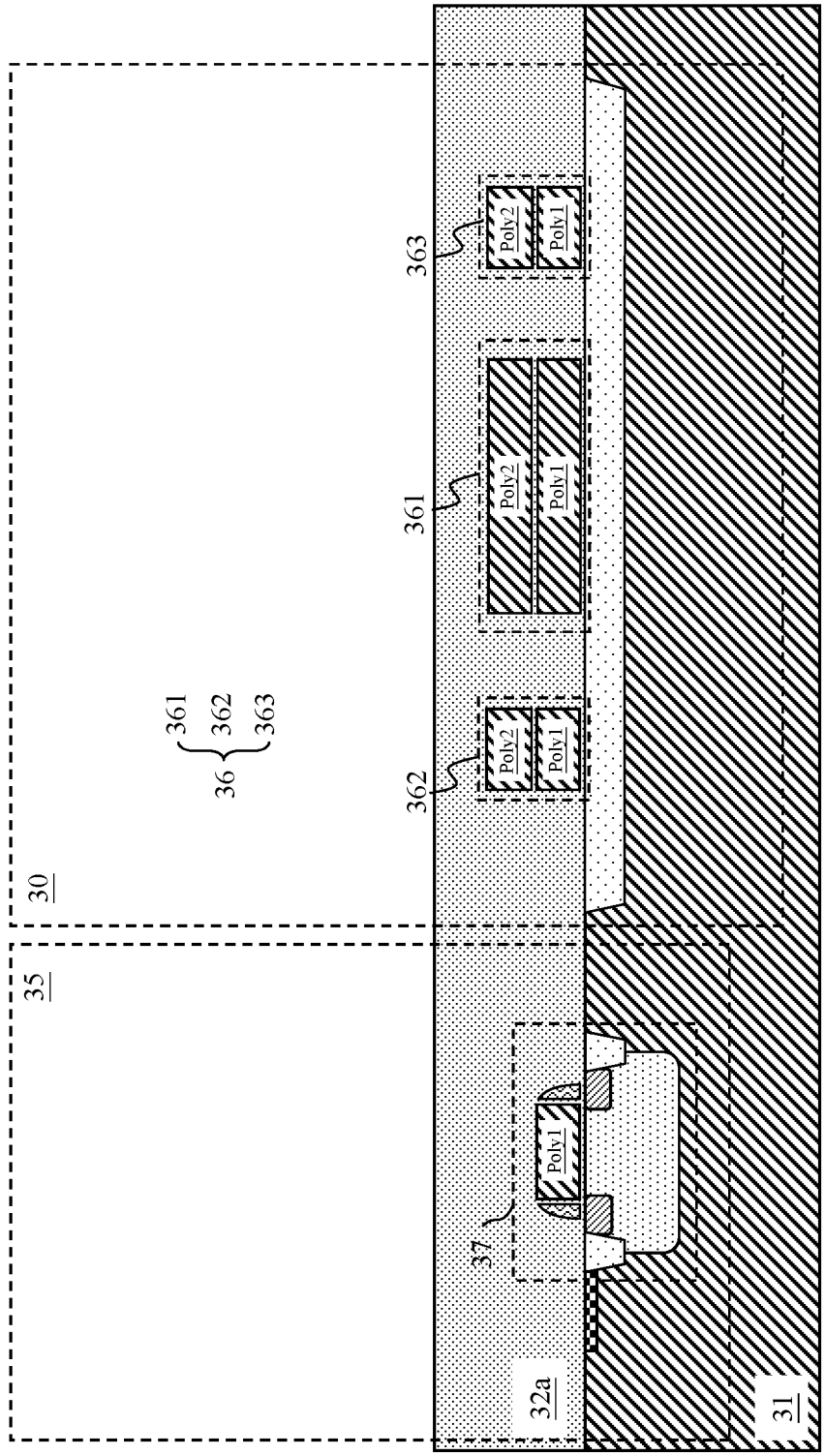

Next, as shown in FIG. 4B, a first dielectric layer 32a is formed, and the MOS device 37 and the sensor region 36 are buried in the first dielectric layer 32a. The first dielectric layer 32a is configured to electrically insulate the MOS device 37 and the sensor region 36 from other conductive structures.

Figure 4C:
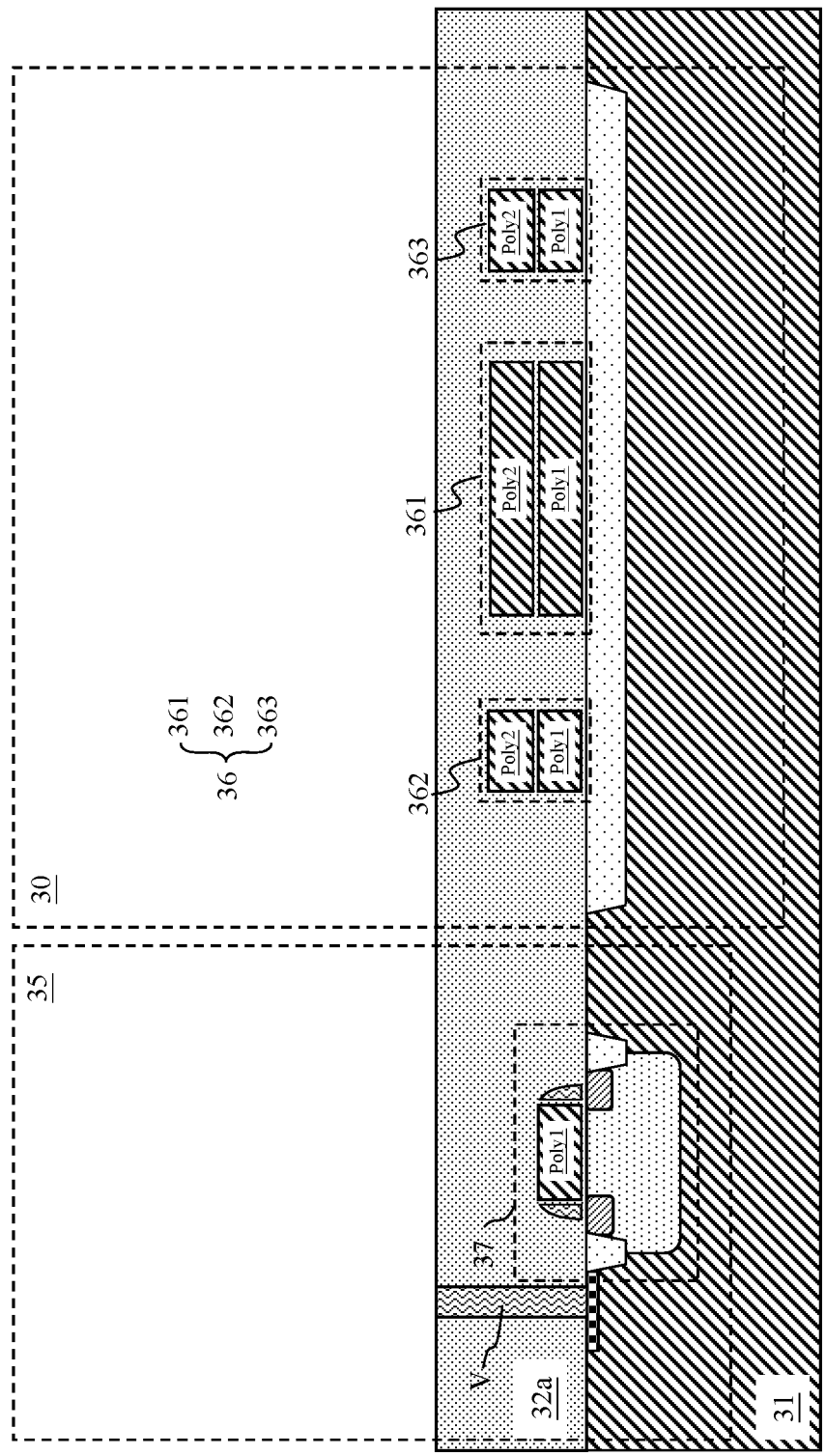

Next, as shown in FIG. 4C, a conductive plug V is formed in the first dielectric layer 32a. Other conductive plugs V will be formed in subsequent process steps. The conductive plugs V are conductive, and are configured to electrically connect the metal layers.

Figure 4D:
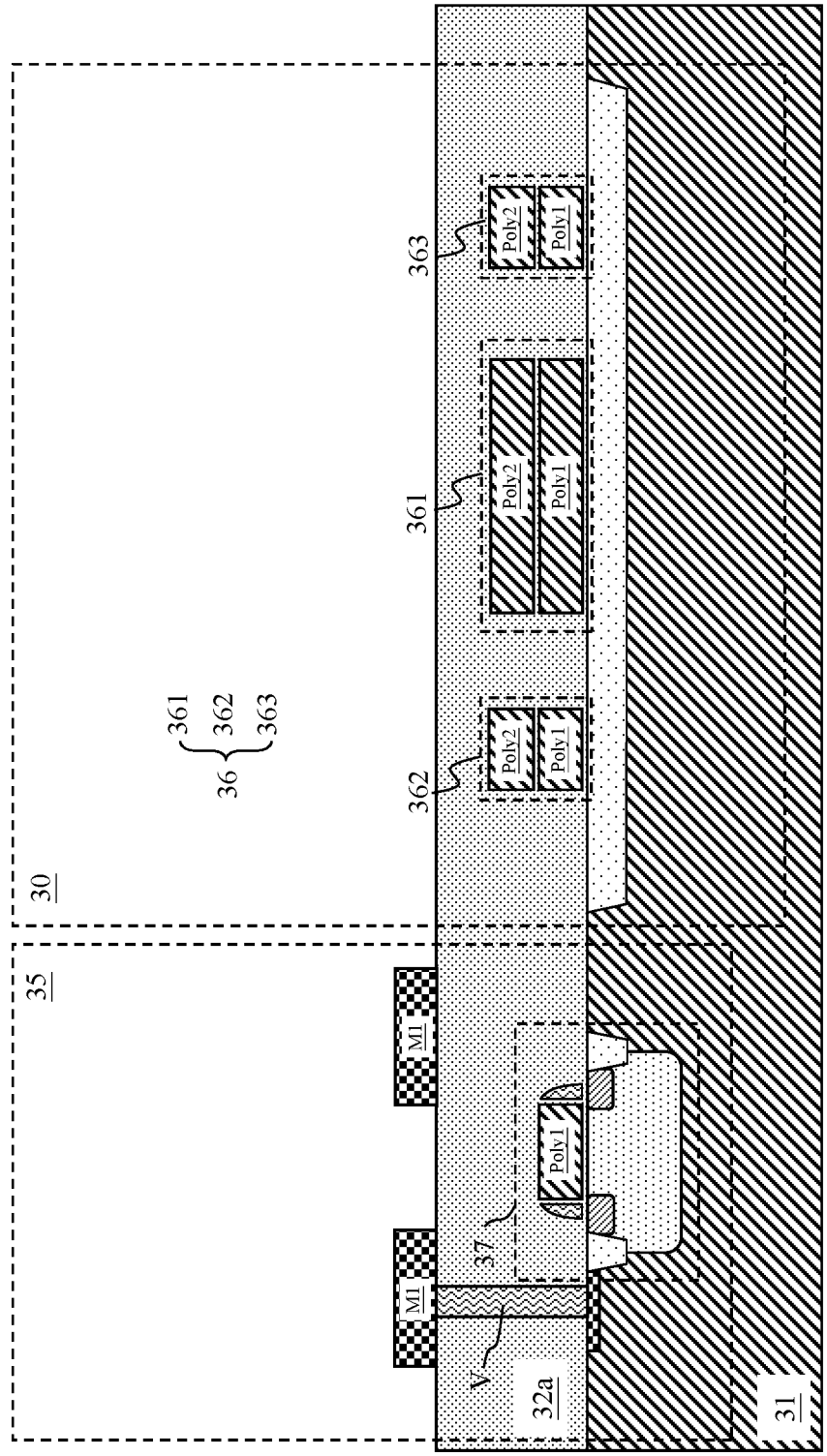

Next, as shown in FIG. 4D, a metal layer M1 is formed on the first dielectric layer 32a and in contact with the first dielectric layer 32a, and is electrically connected to the aforementioned conductive plug V.

Figure 4E:
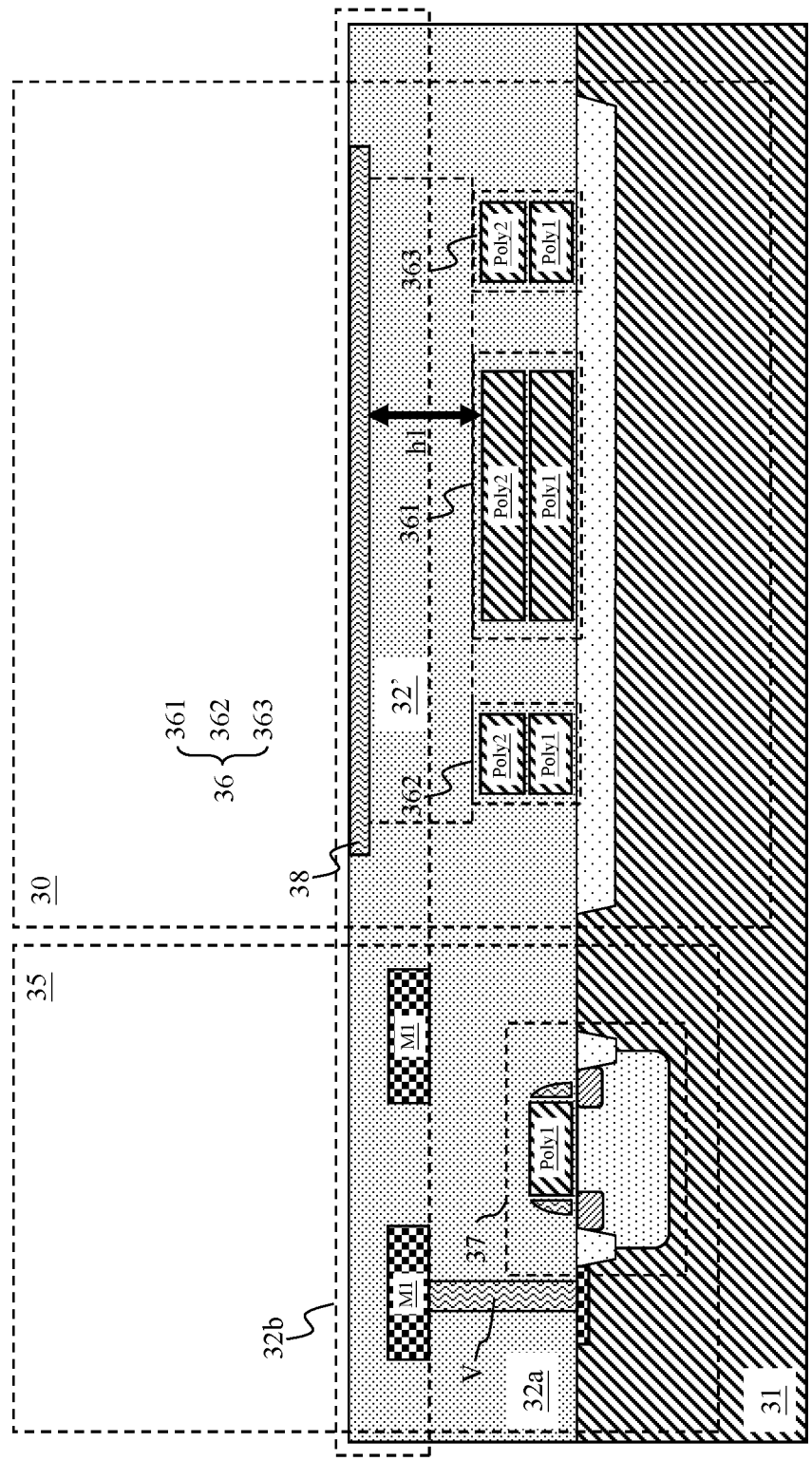

Next, as shown in FIG. 4E, a second dielectric layer 32b is formed on the first dielectric layer 32a, and the metal layer M1 is buried in the second dielectric layer 32b. As shown in FIG. 4E, a stop layer 38 is formed on the second dielectric layer 32b, and the stop layer 38 is located vertically above the sensor region 36.

As shown in FIG. 4E, part of the first dielectric layer 32a and part of the second dielectric layer 32b, which are vertically above the sensor region 36, will become the dielectric layer 32' later. The dielectric layer 32' has the thickness h2. The stop layer 38 is deposited between the sensor dielectric layer 32' and the sacrificial metal layer M2' which is to be formed later.

Figure 4F:
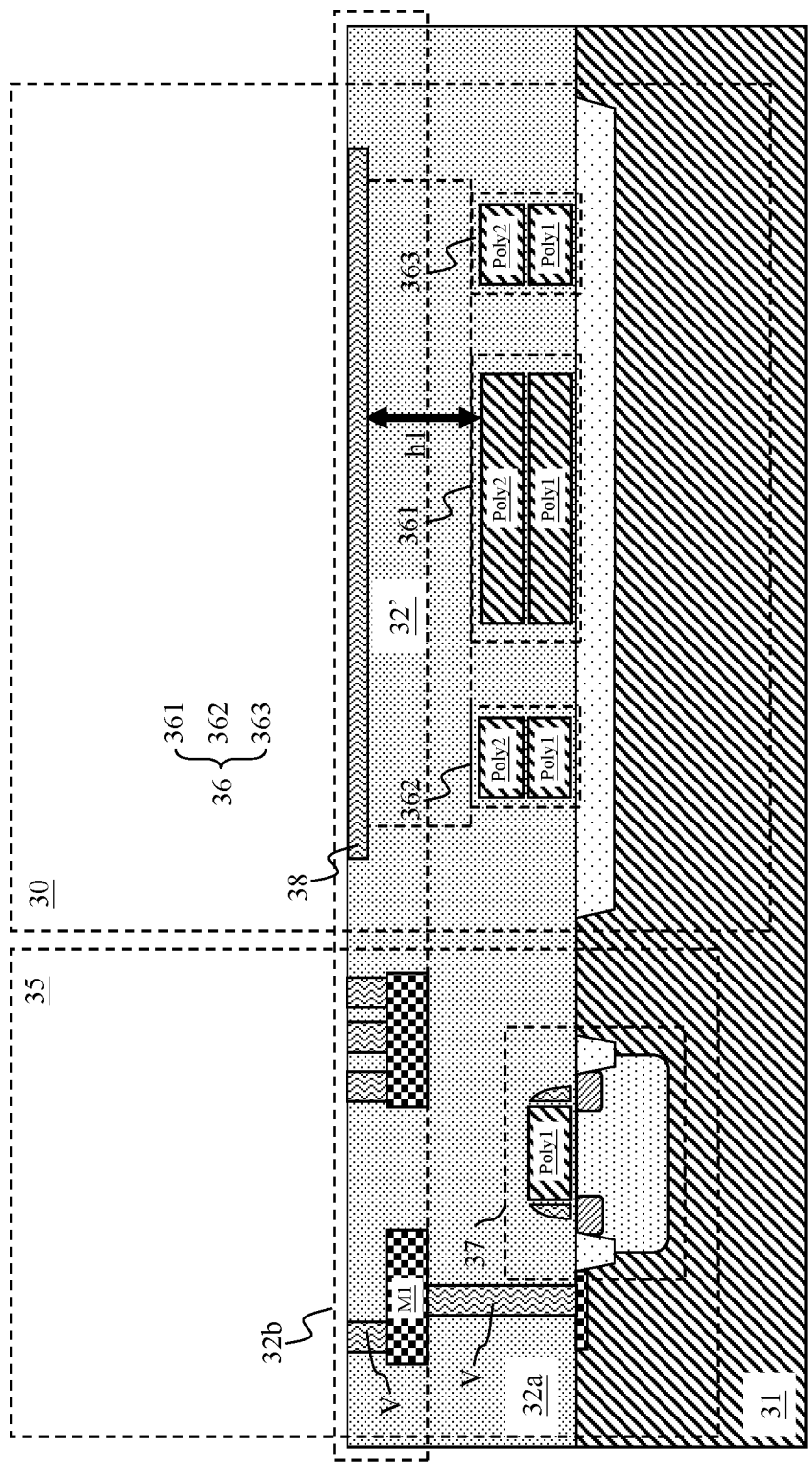

Next, as shown in FIG. 4F, other conductive plugs V are formed on the metal layer M1, and are electrically connected to the metal layer M1.

Figure 4G:
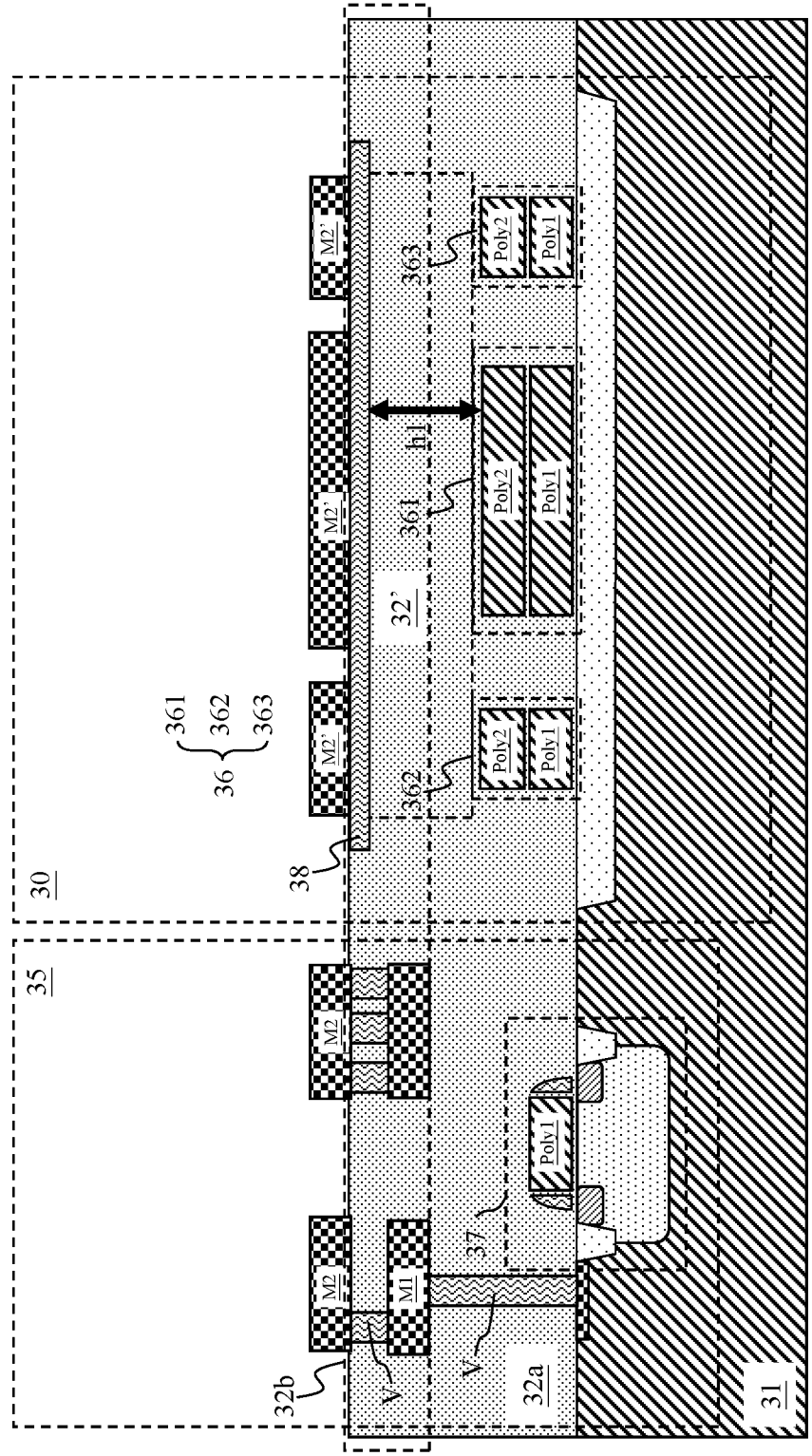

Next, as shown in FIG. 4G, a metal layer M2 and the sacrificial metal layer M2' are formed by a same metal deposition process step. The metal layer M2 is located in the periphery circuit 35 on the second dielectric layer 32b vertically above the metal layer M1. The sacrificial metal layer M2' is located in the FIR sensor device 30 vertically above the sensor region 36, and is in contact with the stop layer 38. The sacrificial metal layer M2' is deposited on the sensor dielectric layer 32'.

Figure 4H:
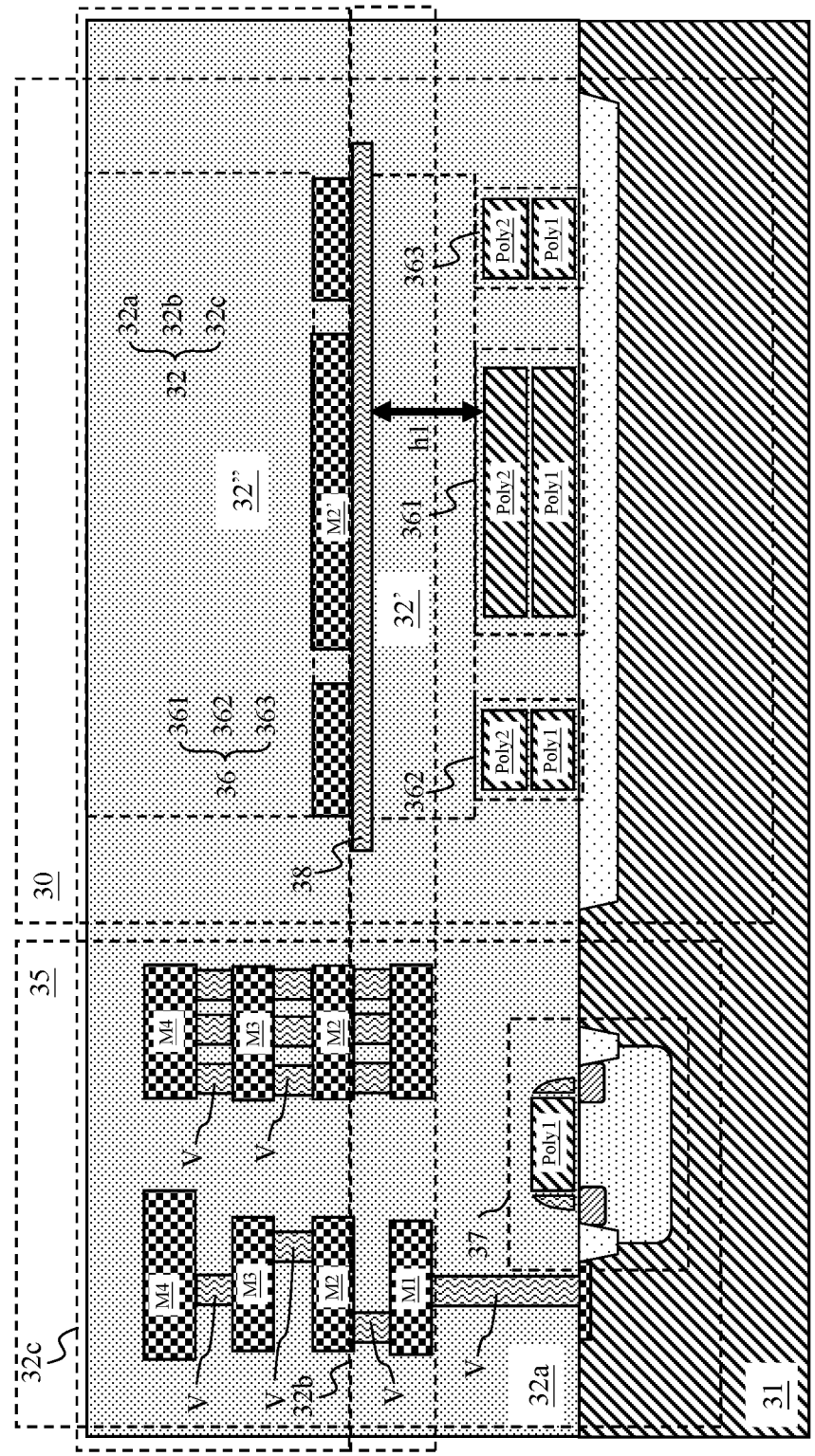

Next, as shown in FIG. 4H, a third dielectric layer 32c, metal layers M3 and M4, and further other conductive plugs V are formed. The third dielectric layer 32c is formed on the second dielectric layer 32b, and the metal layers M3 and M4 and the conductive plugs V above the metal layer M2 are buried in the third dielectric layer 32c, i.e., the metal layers M3 and M4 and the conductive plugs V above the metal layer M2 are located in the third dielectric layer 32c. As shown in FIG. 4H, part of the third dielectric layer 32c is located vertically above the sacrificial metal layer M2' and the sensor region 36, and is used as the intermediate dielectric layer 32". The sensor dielectric layer 32 includes the first dielectric layer 32a, the second dielectric layer 32b, and the third dielectric layer 32c.

Figure 4I:
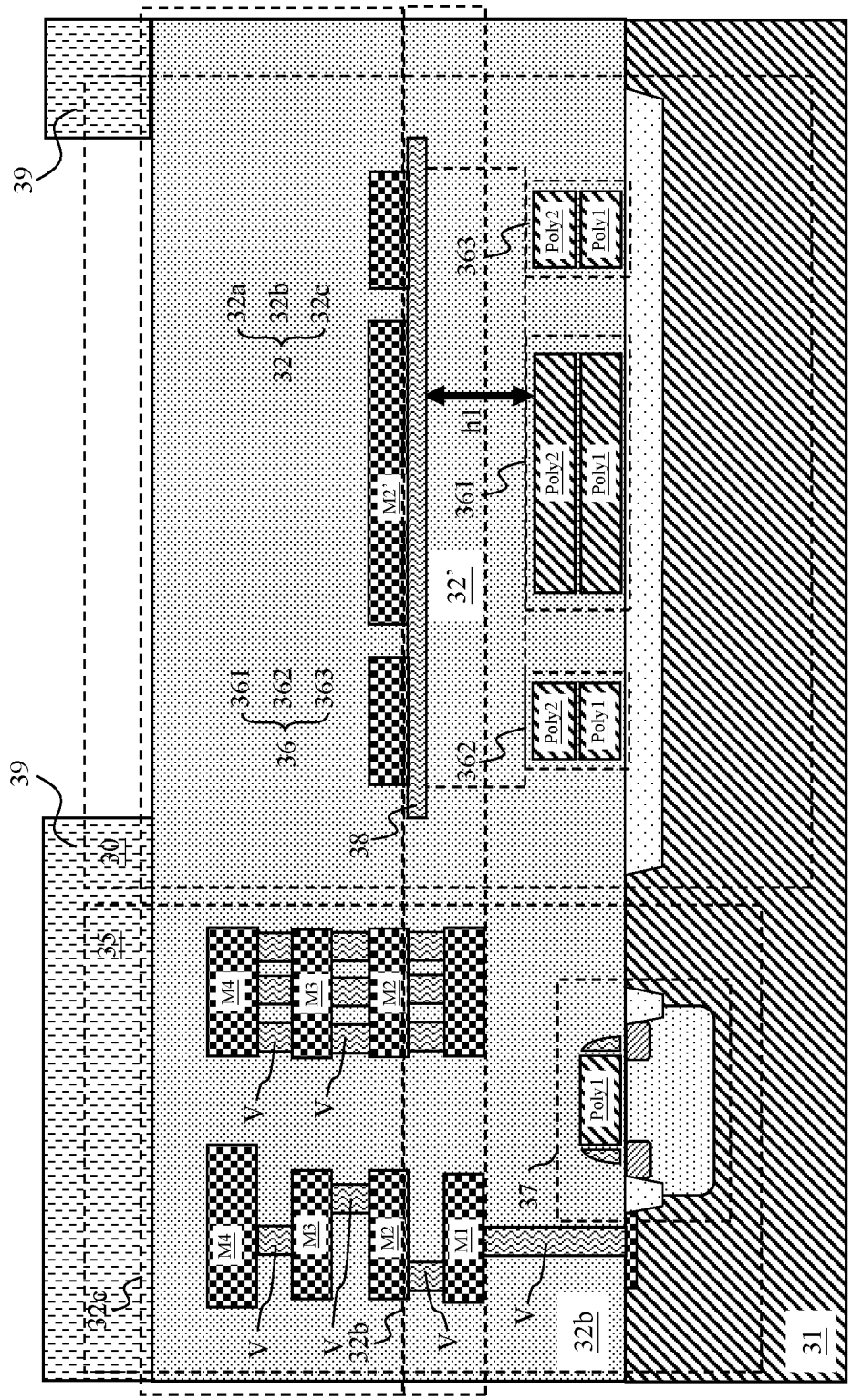

Next, as shown in FIG. 4I, a photoresist layer 39 is formed on the third dielectric layer 32c as a stop layer of the first etch process step.

Figure 4J:
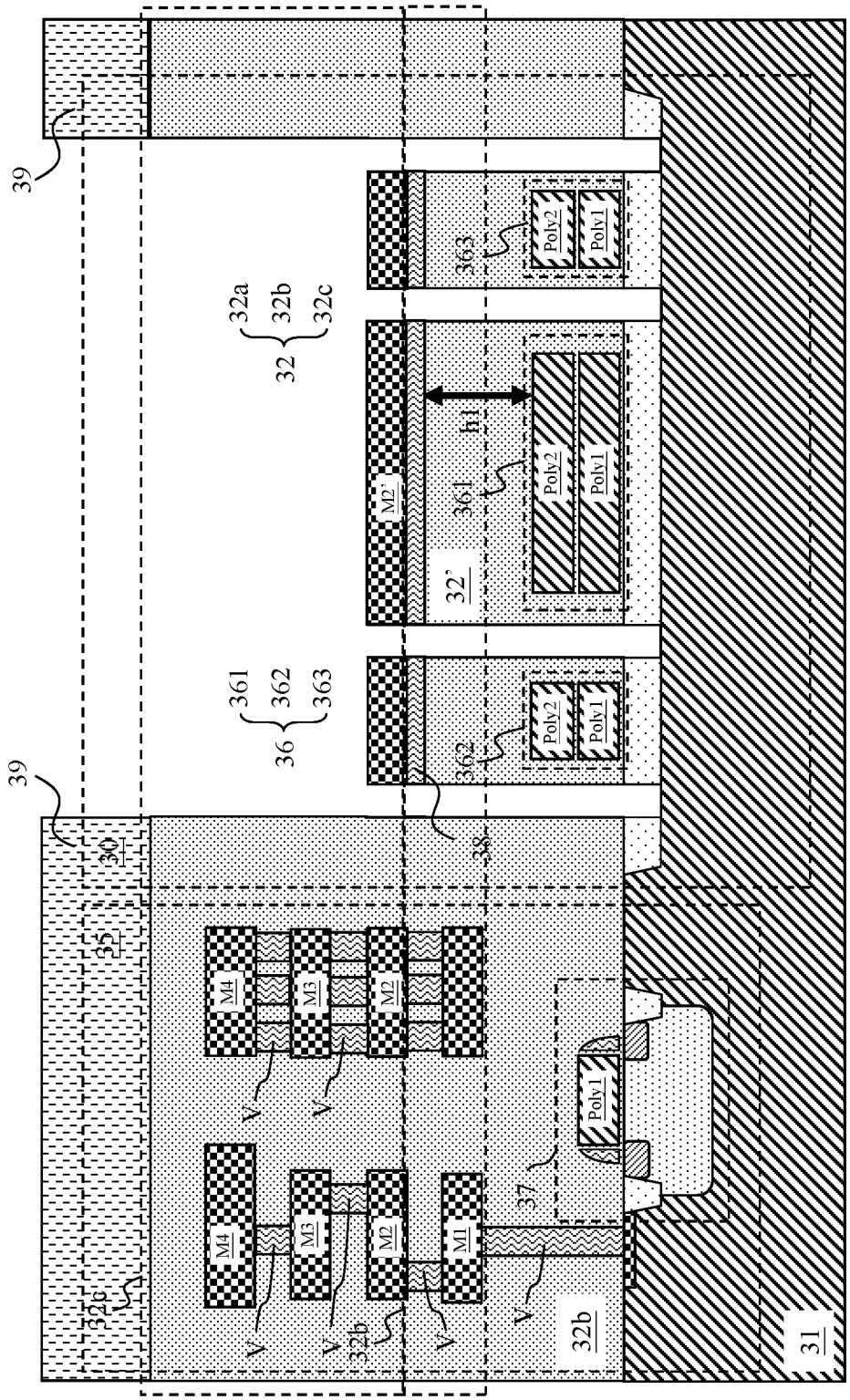

Next, as shown in FIG. 4J, the intermediate dielectric layer 32" and part of the sensor dielectric layer 32' are etched by a first etch process step. The etch rate of the first etch process step etching the intermediate dielectric layer 32" is higher than the etch rate of the first etch process step etching the sacrificial metal layer M2', wherein the sacrificial metal layer M2' is an etch stop layer of the first etch process step. For example, the etch rates of the first etch process step etching an oxide layer (such as the intermediate dielectric layer 32", which in this embodiment is a silicon dioxide layer) and a nitride layer (such as a silicon nitride layer) are much higher than the etch rate of the first etch process step etching a metal layer (such as the sacrificial metal layer M2') and a semiconductor layer (such as the substrate 31, which in this embodiment is a single crystal silicon layer). In one preferable embodiment, the first etch process step is an anisotropic dry etch process step; as thus, a trench shown in FIG. 4J is formed.

Figure 4K:
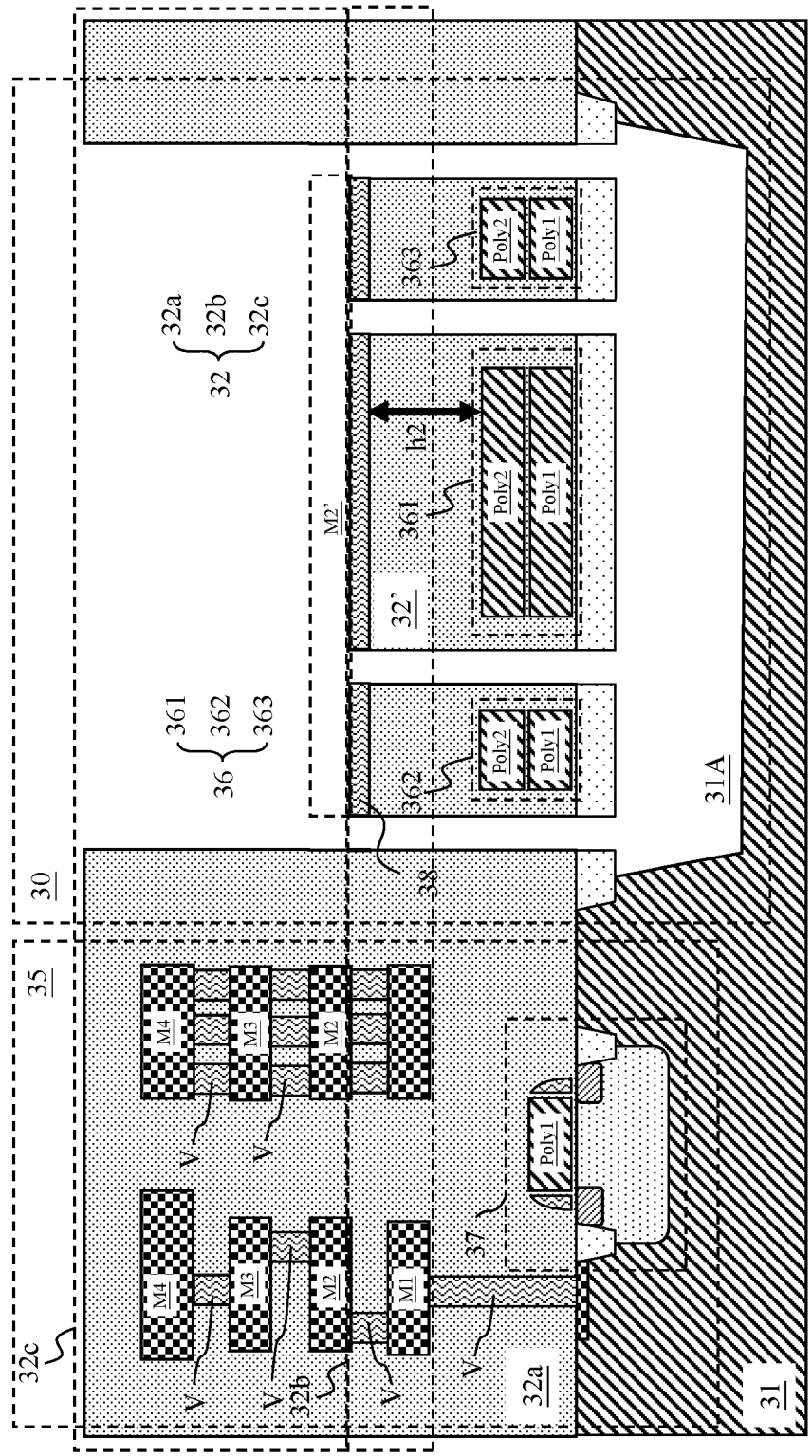

Next, as shown in FIG. 4K, the sacrificial metal layer M2' and part of the substrate 31 are etched by the second etch process step. The part of the substrate 31 is etched by the second etch process step to form an empty chamber. The etch rate of the second etch process step etching the sacrificial metal layer M2' is higher than the etch rate of the second etch process step etching the stop layer 38, wherein the stop layer 38 is the etch stop layer of the second etch process step. The second etch process step is the isotropic etch process step. In one preferable embodiment, the second etch process step is a wet etch process step, which employs an etch solution including tetramethylammonium hydroxide (TMAH) solution and/or potassium hydroxide (KOH) solution.

The periphery circuit 35 is formed on the substrate 31 outside the FIR sensor device 30, wherein the periphery circuit 35 includes at least one metal oxide semiconductor (MOS) device 37 and plural metal layers M1-M4. One of the metal layers M1-M4, i.e. the metal layer M2 in this embodiment, and the sacrificial metal layer M2', are formed by a same metal deposition process step.

The first etch process step is an anisotropic etch process step, and the second etch process step is an isotropic etch process step.

Figure 4L:
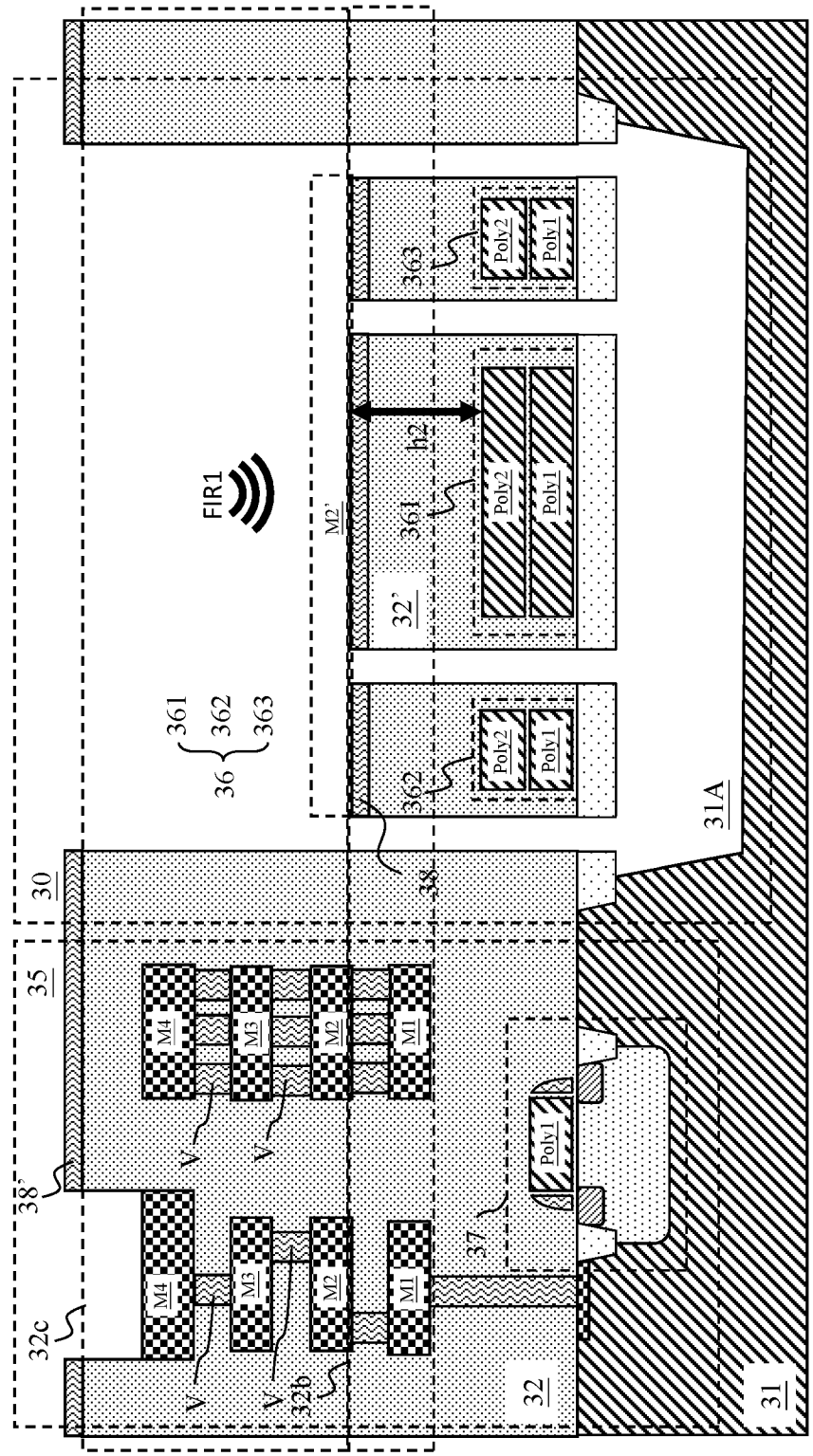

Next, as shown in FIG. 4L, in one embodiment, a silicon nitride layer 38' is formed on the dielectric layer 32; next, part of the dielectric layer 32 is etched by an etch process step, to expose metal pads of the metal layer M4, wherein the metal pads are configured to electrically connect an external circuit.

Figure 5:
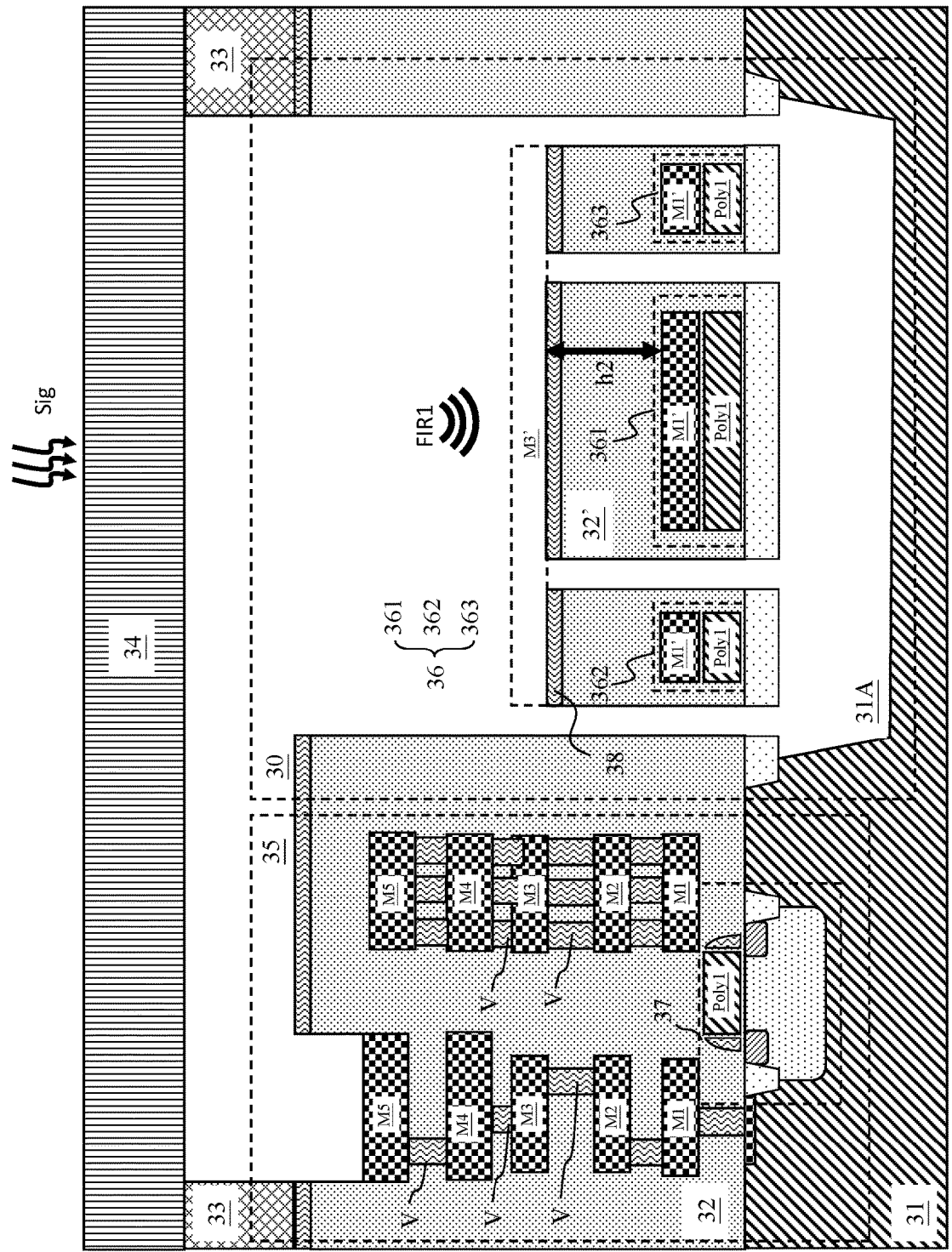
FIG. 5 is a schematic diagram showing a cross-section view of an FIR sensor device according to one embodiment of the present invention.

FIG. 5 is a schematic diagram showing a cross-section view of an FIR sensor device according to one embodiment of the present invention. As shown in FIG. 5, the FIR sensor device 30 and the periphery circuit 35 are formed on the substrate 31. In this embodiment, each of the thermopile structure 261 and the partition structures 262 and 263 includes for example but not limited to, from top to bottom, the metal layer M1' and the poly silicon layer poly1. In one preferable embodiment, the thermopile structure 261 includes at least two thermal conductive layers, and the two thermal conductive layers have different Seebeck parameters. As shown in FIG. 5, the metal layer M1' and the poly silicon layer poly1 are both thermal conductive layers, but the Seebeck parameter of the metal layer M1' and the Seebeck parameter of the poly silicon layer poly1 are different from each other, so ad to sense temperature.

Note that, the FIR sensor device 30 can include not only one thermopile structure 361. In another embodiment, the FIR sensor device 30 can include two or more thermopile structures 361.

A bonding layer 33 is formed on the dielectric layer 32. A filter layer 34 is connected to the dielectric layer 32 through the bonding layer 33. The filter layer 34 can help the FIR sensor device 30 to filter signals other than the far-infrared signals.

The filter layer 34 receives a signal Sig to be sensed, and allows the far infrared component in the signal Sig to pass through, but filters components in other spectrum. In one embodiment, the thickness of the filter layer 34 is for example but not limited to 5-15 μm. In one embodiment, the filter layer 34 is made of a material which is, for example but not limited to, polyethylene (PE), polypropylene(PP), or polyethylene terephthalate (PET). In addition to filtering light, the filter layer 34 can also prevent particles and dirt from entering the thermopile structure 361.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. For example, other process steps or structures which do not affect the primary characteristic of the device, such as a deep well region, etc., can be added; for another example, the lithography process can be replaced by electron beam lithography or other lithography techniques. For another example, it is not limited for each of the embodiments described hereinbefore to be used alone; under the spirit of the present invention, two or more of the embodiments described hereinbefore can be used in combination. For example, two or more of the embodiments can be used together, or, a part of one embodiment can be used to replace a corresponding part of another embodiment. In view of the foregoing, the spirit of the present invention should cover all such and other modifications and variations, which should be interpreted to fall within the scope of the following claims and their equivalents. An embodiment or a claim of the present invention does not need to achieve all the objectives or advantages of the present invention. The title and abstract are provided for assisting searches but not for limiting the scope of the present invention.

What is claimed is:

1. A far infrared (FIR) sensor device, comprising:
a sensor region, which is formed on a substrate, and is configured to operably sense a far infrared signal; and
a sensor dielectric layer, which is formed on the sensor region, wherein a thickness of the sensor dielectric layer is determined by a sacrificial metal layer;
wherein the FIR sensor device is manufactured by a CMOS process, a periphery circuit is formed on the substrate, wherein the periphery circuit includes at least one metal oxide semiconductor (MOS) device and a plurality of metal layers, and wherein one of the plurality of metal layers and the sacrificial metal layer are formed by a same metal deposition process step.

2. The FIR sensor device of claim 1, wherein the thickness of the sensor dielectric layer is determined by steps including:
forming the sensor dielectric layer on the sensor region with the thickness;
depositing the sacrificial metal layer on the sensor dielectric layer;
forming an intermediate dielectric layer on the sacrificial metal layer;
etching the intermediate dielectric layer by a first etch process step, wherein an etch rate of the first etch process step etching the intermediate dielectric layer is higher than an etch rate of the first etch process step etching the sacrificial metal layer, wherein the sacrificial metal layer is an etch stop layer of the first etch process step; and
etching the sacrificial metal layer by a second etch process step.

3. The FIR sensor device of claim 2, further comprising a stop layer which is formed on the sensor dielectric layer.

4. The FIR sensor device of claim 3, wherein the thickness of the sensor dielectric layer is determined further by a process step of depositing the stop layer between the sensor dielectric layer and the sacrificial metal layer;
wherein an etch rate of the second etch process step etching the sacrificial metal layer is higher than an etch rate of the second etch process step etching the stop layer, wherein the stop layer is an etch stop layer of the second etch process step.

5. The FIR sensor device of claim 2, wherein the first etch process step is an anisotropic etch process step, and the second etch process step is an isotropic etch process step.

6. The FIR sensor device of claim 2, wherein the second etch process step is a wet etch process step which employs an etch solution including tetramethylammonium hydroxide (TMAH) solution and/or potassium hydroxide (KOH) solution.

7. The FIR sensor device of claim 1, wherein the FIR sensor device includes a thermopile sensor device.

8. A manufacturing method of a far infrared (FIR) sensor device, comprising:
forming a sensor region in a substrate, wherein the sensor region is configured to operably sense a far infrared signal;
forming a sensor dielectric layer on the sensor region with a thickness;
depositing a sacrificial metal layer on the sensor dielectric layer;
forming an intermediate dielectric layer on the sacrificial metal layer;
etching the intermediate dielectric layer by a first etch process step, wherein an etch rate of the first etch process step etching the intermediate dielectric layer is higher than an etch rate of the first etch process step etching the sacrificial metal layer, wherein the sacrificial metal layer is an etch stop layer of the first etch process step; and
etching the sacrificial metal layer by a second etch process step.

9. The manufacturing method of claim 8, wherein a periphery circuit is formed on the substrate, wherein the periphery circuit at includes least one metal oxide semiconductor (MOS) device and a plurality of metal layers, and wherein one of the plurality of metal layers and the sacrificial metal layer are formed by a same metal deposition process step.

10. The manufacturing method of claim 8, further comprising:
depositing a stop layer between the sensor dielectric layer and the sacrificial metal layer;
wherein an etch rate of the second etch process step etching the sacrificial metal layer is higher than an etch rate of the second etch process step etching the stop layer, wherein the stop layer is an etch stop layer of the second etch process step.

11. The manufacturing method of claim 8, wherein the first etch process step is an anisotropic etch process step, and the second etch process step is an isotropic etch process step.

12. The manufacturing method of claim 8, wherein the second etch process step is a wet etch process step which employs an etch solution including tetramethylammonium hydroxide (TMAH) solution and/or potassium hydroxide (KOH) solution.

13. The manufacturing method of claim 8, wherein the FIR sensor device includes a thermopile sensor device.

14. A determination method of a thickness of a sensor dielectric layer of a far infrared (FIR) sensor device, wherein the FIR sensor device is formed on a substrate, and includes: a sensor region, which is configured to operably sense a far infrared signal; and a sensor dielectric layer, which is formed on the sensor region with a thickness; the determination method comprising:
depositing a sacrificial metal layer on the sensor dielectric layer;
forming an intermediate dielectric layer on the sacrificial metal layer;
etching the intermediate dielectric layer by a first etch process step, wherein an etch rate of the first etch process step etching the intermediate dielectric layer is higher than an etch rate of the first etch process step etching the sacrificial metal layer, wherein the sacrificial metal layer is an etch stop layer of the first etch process step; and
etching the sacrificial metal layer by a second etch process step.

15. The determination method of claim 14, wherein a periphery circuit is formed on the substrate, wherein the periphery circuit at includes least one metal oxide semiconductor (MOS) device and a plurality of metal layers, and wherein one of the plurality of metal layers and the sacrificial metal layer are formed by a same metal deposition process step.

16. The determination method of claim 14 further comprising:
depositing a stop layer between the sensor dielectric layer and the sacrificial metal layer;
wherein an etch rate of the second etch process step etching the sacrificial metal layer is higher than an etch rate of the second etch process step etching the stop layer, wherein the stop layer is an etch stop layer of the second etch process step.

17. The determination method of claim 14, wherein the first etch process step is an anisotropic etch process step, and the second etch process step is an isotropic etch process step.

18. The determination method of claim 14, wherein the second etch process step is a wet etch process step which employs an etch solution including tetramethylammonium hydroxide (TMAH) solution and/or potassium hydroxide (KOH) solution.

19. The determination method of claim 14, wherein the FIR sensor device includes a thermopile sensor device.

\* \* \* \* \*